United States Patent [19]
Shimura et al.

[11] Patent Number: 6,070,780
[45] Date of Patent: Jun. 6, 2000

[54] BONDING APPARATUS

[75] Inventors: Masayuki Shimura, Tokorozawa; Hisashi Arai, Akiruno; Masaki Okawara, Sayama, all of Japan

[73] Assignee: Kabushiki Kaisha Shinkawa, Tokyo, Japan

[21] Appl. No.: 09/001,183

[22] Filed: Dec. 30, 1997

[30] Foreign Application Priority Data

Jan. 4, 1997 [JP] Japan ..................................... 9-010757

[51] Int. Cl.[7] ............................. B23K 37/00; B23K 1/00; B23K 15/00; B23K 37/04
[52] U.S. Cl. .......................... 228/44.7; 228/4.5; 228/6.2; 228/49.5
[58] Field of Search ............................ 228/4.5, 6.2, 44.7, 228/49.5, 180.1, 180.21, 212, 234.1

[56] References Cited

U.S. PATENT DOCUMENTS

| | | | |
|---|---|---|---|
| 4,166,562 | 9/1979 | Keizer et al. ............................. | 228/5.1 |
| 5,009,590 | 4/1991 | Mitarai et al. ........................... | 432/121 |
| 5,082,165 | 1/1992 | Ishizuka .................................. | 228/179 |
| 5,201,450 | 4/1993 | Ahn ......................................... | 228/4.5 |
| 5,579,980 | 12/1996 | Ichikawa ................................. | 228/6.2 |
| 5,579,985 | 12/1996 | Ichikawa ................................. | 228/102 |
| 5,749,442 | 5/1998 | Kikuchi .................................. | 187/272 |

*Primary Examiner*—Patrick Ryan
*Assistant Examiner*—Kiley Stoner
*Attorney, Agent, or Firm*—Koda & Androlia

[57] ABSTRACT

A bonding device equipped with a heating block for heating, for instance, a lead frame upon which bonding is performed including vacuum suction nozzles, which are installed above the heating block so as to lift the lead frame, and an air-cylinder, which raises and lowers the vacuum suction nozzles. The lead frame is lifted from the heating block by the vacuum suction nozzles, thus being prevented from being overly heated by the heating block.

3 Claims, 3 Drawing Sheets

FIG. 2
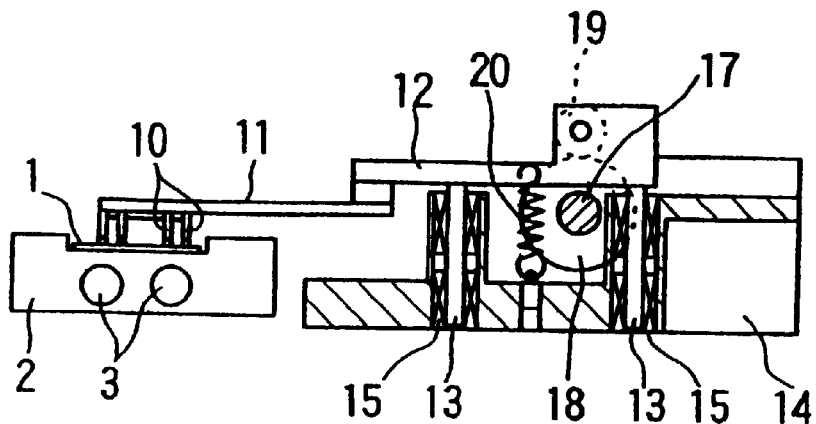
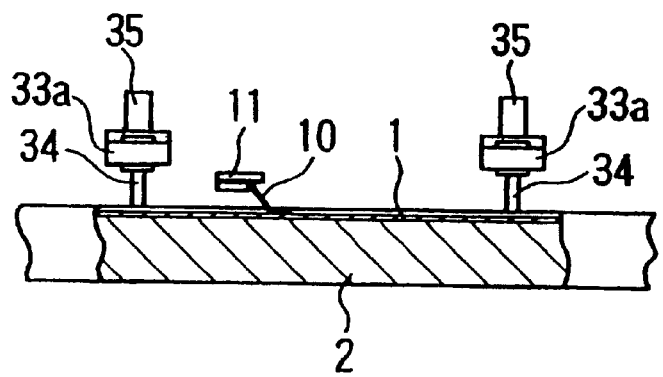
FIG. 3 (a)
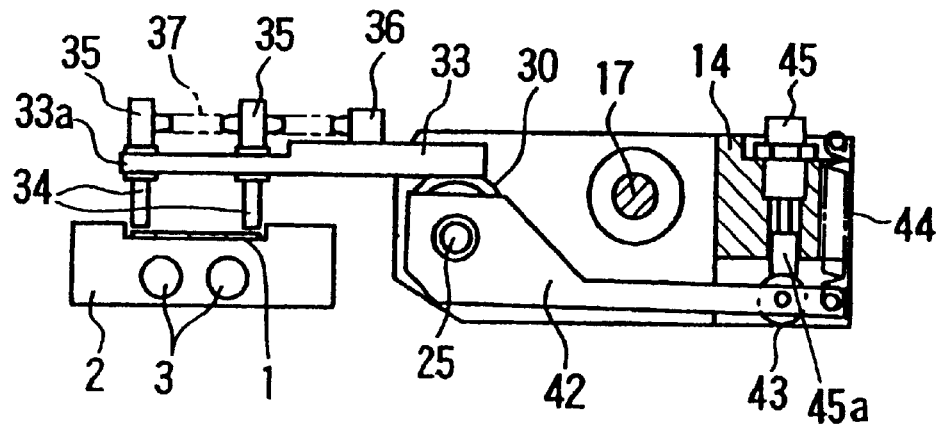
FIG. 3 (b)

BONDING APPARATUS

BACKGROUND OF THE INVENTION

1. Field of the Invention

The present invention relates to a bonding apparatus such as a die bonding apparatus, wire bonding apparatus, etc.

2. Prior Art

A bonding apparatus is equipped with a heating block that heats lead frames. In other words, before bonding is performed on lead frames, the lead frames are placed on the heating block which has been heated to a temperature of 150 to 500° C.; and bonding is performed after the lead frames are sufficiently heated by the heating block. If for some reason the conveying out of the lead frames from the heating block is stopped, the lead frames are exposed to continuous heating; as a result, the lead frames may be deformed, or the semiconductor chips (also called dies or pellets) mounted on the lead frames may be damaged.

Such a failure of normal conveying of the lead frames may result from various reasons. Such reasons include repeated detection due to the generation of detection errors caused by lack of agreement in shape recognition and detection of positional deviations of the lead frames, power failure in the heater of the bonding tool which performs bonding, and (in the case of a wire bonding apparatus) damage to the capillary, faulty wire feeding, etc.

Conventionally, the above-described excess heating of lead frames is prevented by a heating block raising-and-lowering mechanism. This mechanism raises and lowers the heating block; and when normal conveying of the lead frames is interrupted, the heating block is lowered so that heating of the lead frames is stopped.

However, in the above mechanism, since the heating block is heated by a heater, the heating block raising-and-lowering mechanism needs to have a good heat resistance and durability. Furthermore, since the heating block raising-and-lowering mechanism raises and lowers a heavy heating block and is built into a frame feeder that feeds the lead frames, the heating block raising-and-lowering mechanism tends to be large and has an extremely complicated structure, resulting in high manufacturing costs. Moreover, since the heating block raising-and-lowering mechanism has a complex structure, considerable maintenance time is required for periodic maintenance.

SUMMARY OF THE INVENTION

Accordingly, the object of the present invention is to provide a bonding apparatus which can prevent thermal damage to lead frames, etc. by means of a simple structure.

The object is accomplished by a unique structure for a bonding apparatus which bonds semiconductor chips to lead frames positioned on a heating block or which bonds wires between semiconductor chips and leads of lead frames, and such a bonding apparatus includes a frame lifting means which is installed above a heating block and lifts lead frames, and a driving means which raises and lowers the frame lifting means, so that lead frames on the heating block are lifted by the frame lifting means in cases where normal conveying of the lead frames is not performed.

BRIEF DESCRIPTION OF THE DRAWINGS

FIG. 2 is a sectional view of the lead frame retaining mechanism of the bonding apparatus taken along line 2—2 in FIG. 1;

FIG. 3 illustrates the constituting elements during bonding, in which FIG. 3(a) is a partially sectional front view of the heating block viewed along arrows a—a in FIG. 1, and FIG. 3(b) is a partially sectional side view of the lead frame withdrawing section taken along the line b—b in FIG. 1;

FIG. 4 illustrates the constituting elements before the lead frame is lifted from the heating block, in which

FIG. 5 illustrates the constituting elements after the lead frame is lifted from the heating block, in which

DETAILED DESCRIPTION OF THE INVENTION

One embodiment of the present invention will be described with reference to FIGS. 1 through 5.

Figure 1:
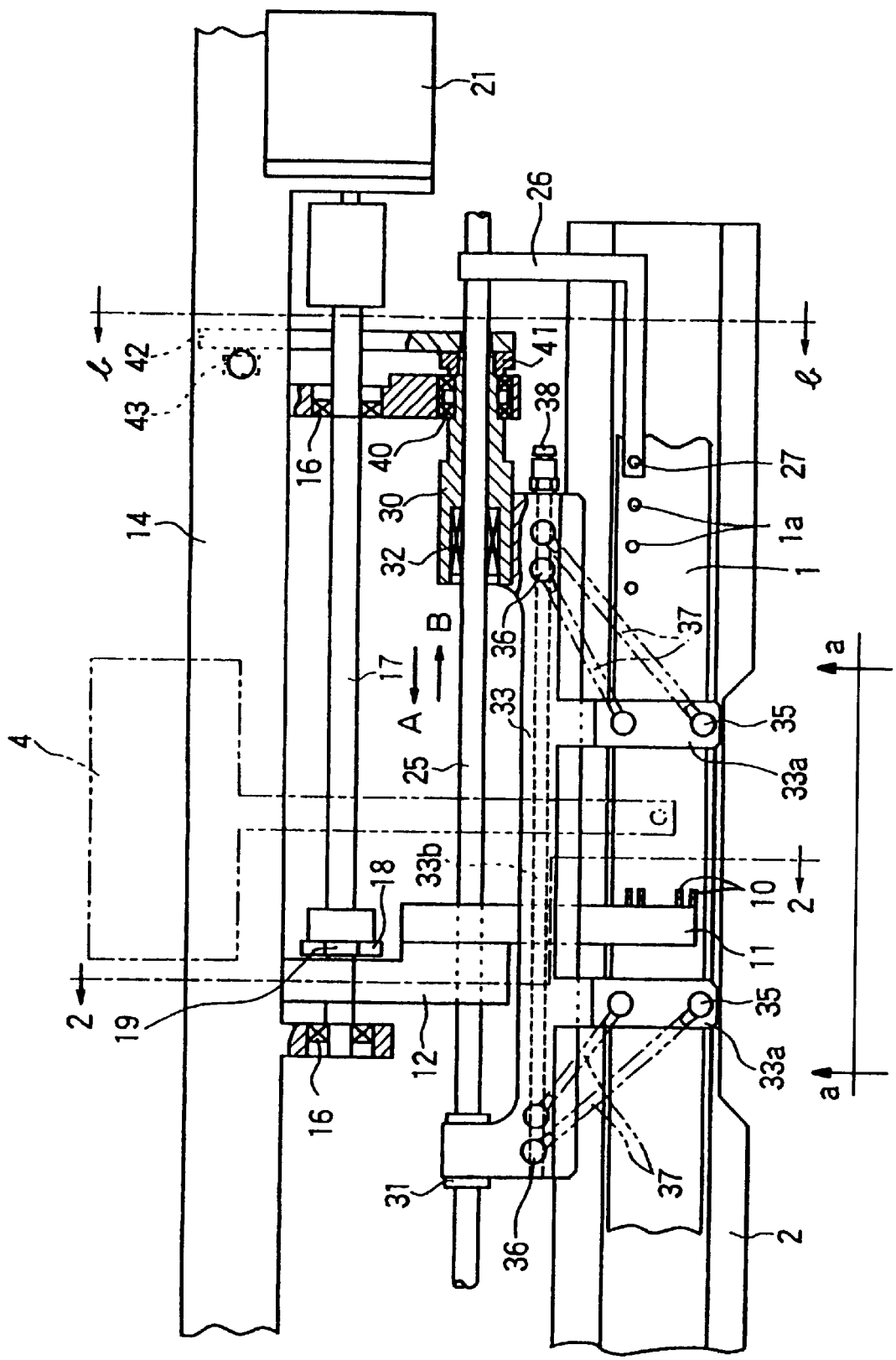
FIG. 1 is a top view which illustrates one embodiment of the bonding apparatus of the present invention.

As shown in FIGS. 1 and 2, a heating block 2 which heats lead frames 1 placed thereon is equipped with heaters 3 inside, and a bonding apparatus 4 such as a die bonding apparatus which bonds semiconductor chips to the lead frames 1, or a wire bonding apparatus which connects wires between the bumps on semiconductor chips and the lead parts of the lead frames 1, etc. is installed on one side of the heating block 2.

Lead frame retaining springs 10 which press the lead frames 1 against the heating block 2 are provided above the heating block 2. In other words, the frame retaining springs 10 are attached to one end of a spring holder 11 which is fastened to a raising-and-lowering block 12, and two guide shafts 13 are fastened to the undersurface of the raising-and-lowering block 12. The guide shafts 13 are inserted into linear bearings 15 provided in a base plate 14, so that the guide shafts 13 can move upward and downward (in FIG. 2).

A rotating shaft 17 is supported on the base plate 14 via bearings 16, and an eccentric cam 18 is fastened to this rotating shaft 17. A roller 19 is rotatably supported on the raising-and-lowering block 12 so as to be in contact with the upper surface of the eccentric cam 18. A spring 20 is mounted between the raising-and-lowering block 12 and the base plate 14, thus the roller 19 makes a pressing contact with the eccentric cam 18. The rotating shaft 17 is coupled to the output shaft of a motor 21 which is mounted on the base plate 14.

A feed pin drive shaft 25 is installed parallel to the heating block 2 on one side of the heating block 2. The feed pin drive shaft 25 is pivotable and caused to make a reciprocating motion in the directions of arrows A and B by a driving means (not shown). A frame feeding lever 26 is fastened to the feed pin drive shaft 25, and a feed pin 27 which is engageable with feeding holes 1a formed at regular intervals in the lead frames I is attached to the frame feeding lever 26.

As seen from FIGS. 1 and 3, bearing holders 30 and 31 are provided on the feed pin drive shaft 25 via bearings 32 (only one shown) so that the bearing holders 30 and 31 are rotatable and slidable on the shaft 25. Furthermore, a frame withdrawing arm 33 is fastened to these bearing holders 30 and 31.

The frame withdrawing arm 33 has a pair of nozzle supports 33a which extend over the heating block 2, and vacuum suction nozzles 34 are provided on the nozzle supports 33a. In the shown embodiment, four vacuum suction connecters 35 are provided on the upper ends of the vacuum suction nozzles 34. Furthermore, a vacuum passage 33b which is a blind hole is formed in the frame withdrawing arm 33. Connecting elements 36 communicate with the vacuum passage 33b are provided on the upper surface of the frame withdrawing arm 33 so as to respectively correspond to the vacuum suction connecters 35, and these connecting elements 36 are connected to the vacuum suction connecters 35 by pipes 37.

Furthermore, an input connecting member 38 is attached to one end of the frame withdrawing arm 33 so as to communicate with the vacuum passage 33b. The input connecting member 38 is connected to a vacuum pump via a pipe and electromagnetic valve (which are not shown).

As seen from FIG. 1, the bearing holder 30 is rotatably supported on the base plate 14 via a bearing 40. A retaining bridge 41 is fastened to the bearing holder 30 so that the retaining bridge 41 holds the inner race of the bearing 40 from both sides. Accordingly, even when the feed pin drive shaft 25 pivots and moves in the direction of arrows A and B, the frame withdrawing arm 33 fastened to the bearing holder 30 is prevented from pivoting or moving in the direction of arrows A and B together with the feed pin drive shaft 25. A swing arm 42 is fastened to the retaining bridge 41 at one end thereof, and a roller 43 is rotatably provided on the other end of the swing arm 42.

Since the frame withdrawing arm 33 and swing arm 42 are provided on the bearing holder 30, and the bearing holder 30 is pivotally provided on the feed pin drive shaft 25 via the bearing 32 as described above, the frame withdrawing arm 33 and swing arm 42 can pivot about the feed pin drive shaft 25.

Furthermore, a spring 44 is mounted between one end of the swing arm 42 and the base plate 14 so that the vacuum suction nozzles 34 are pressed against the lead frames 1 placed on the heating block 2. An air cylinder 45 is provided on the base plate 14, and the operating rod 45a of the air cylinder 45 is set so as to face the upper surface of the roller 43.

The operation will be described below.

FIGS. 2 and 3 show that a lead frame 1 is positioned so as to be bonded. In this case, the lead frame 1 is pressed against the heating block 2 by the frame retaining springs 10 (see FIG. 3(*a*)); and the operating rod 45a of the air cylinder 45 is protruded so as to press the roller 43 downward, thus keeping the vacuum suction nozzles 34 from contacting the lead frame 1 (see FIG. 3(*b*)). In this state, semiconductor chips are die-bonded to the lead frame 1, or a wire is bonded between the lead frame 1 and semiconductor chips, by the bonding apparatus 4.

When the bonding is completed, the motor 21 is rotated so that the roller 19 (see FIG. 2) is pushed upward by the rising profile of the eccentric cam 18 that is mounted on the rotating shaft 17. As a result, the raising-and-lower block 12 on which the roller 19 is provided and the spring holder 11 (which is provided on the raising-and-lowering block 12) are raised in parallel, keeping their horizontal posture, so that the frame retaining springs 10 are separated from the lead frame 1.

As a result, a lead frame feeding operation is performed so that the next bonding portion of the lead frame 1 is fed to the bonding position. Since this lead frame feeding operation is universally known, only a brief description will be given below.

The feed pin 27 provided on the frame feeding arm 26 engages with one of the feeding holes 1a of the lead frame 1, and the lead frame 1 is fed by one pitch. In other words, as a result of a forward and reverse pivot motion and reciprocating motion in the direction of arrows A and B of the drive shaft 25, the feed pin 27 can engage with the feeding hole 1a of the lead frame 1 and then move the lead frame; and feeding of the lead frame is accomplished by a square-shaped tact feeding operation of the feed pin 27 within the perpendicular plane. When the next bonding portion of the lead frame 1 is brought to the bonding position, the motor 21 is rotated in the direction opposite from the direction described above, so that the frame retaining springs 10 can press the lead frame 1 against the heating block 2 again. Subsequently, the above-described series of operations are performed.

In the above bonding operation, if the conveying of lead frames 1 should stop due to, for instance, the reasons described in the Prior Art section, the lead frames 1 are subjected to continuous heating by the heating block 2, and deformation of the lead frames 1 or damage to the semiconductor chips mounted on the lead frames 1 may occur.

If such a conveying of the lead frames 1 stops, the frame withdrawing arm 33 operates in the present invention to avoid damages to the lead frames.

Figure 4A:
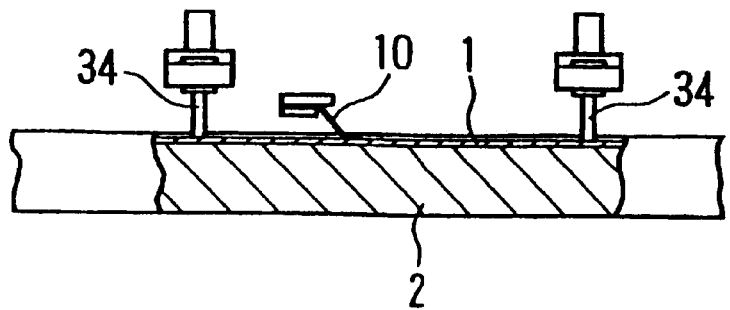
FIG. 4(a) is a partially sectional front view of the heating block viewed along arrows a—a in FIG. 1.
Figure 4B:
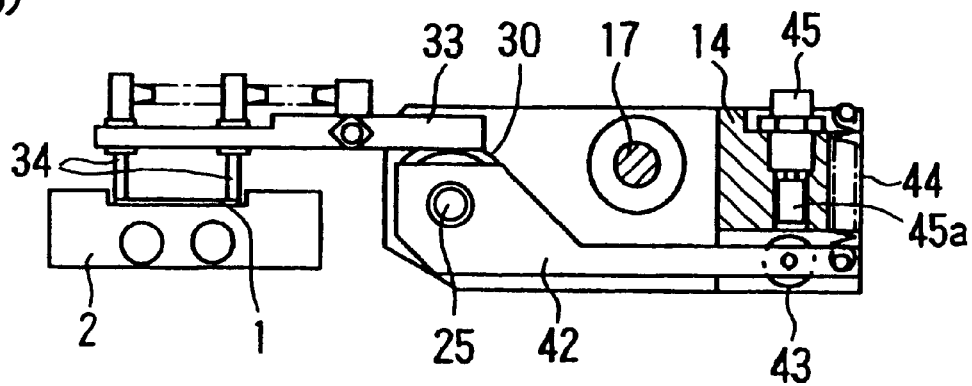
FIG. 4(b) is a partially sectional side view of the lead frame withdrawing section taken along the line b—b in FIG. 1.

More specifically, with the lead frame 1 pressed by the frame retaining springs 10 as shown in FIG. 3(*a*), and with the vacuum suction nozzles 34 separated from the lead frame 1 as shown in FIG. 3(*b*), the operating rod 45a of the air cylinder 45 is retracted from the position shown in FIG. 3(*b*) to the position shown in FIG. 4(*b*). As a result, the swing arm 42, bearing holders 30 and 31 and frame withdrawing arm 33 are caused to pivot in the counterclockwise direction (with respect to FIG. 4(*b*)) about the feed pin drive shaft 25 by the driving (contracting) force of the spring 44, so that the vacuum suction nozzles 34 are moved down and pressed against the lead frame 1.

Figure 5A:
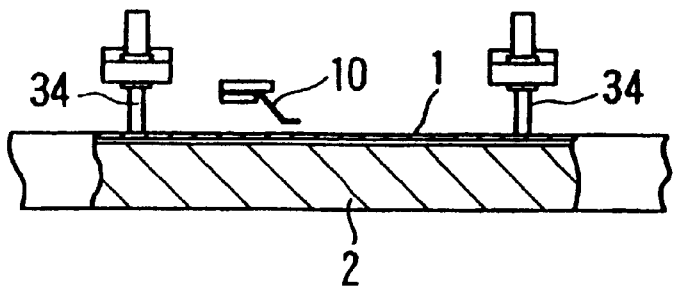
FIG. 5(a) is a partially sectional front view of the heating block viewed along arrows a—a in FIG. 1.
Figure 5B:
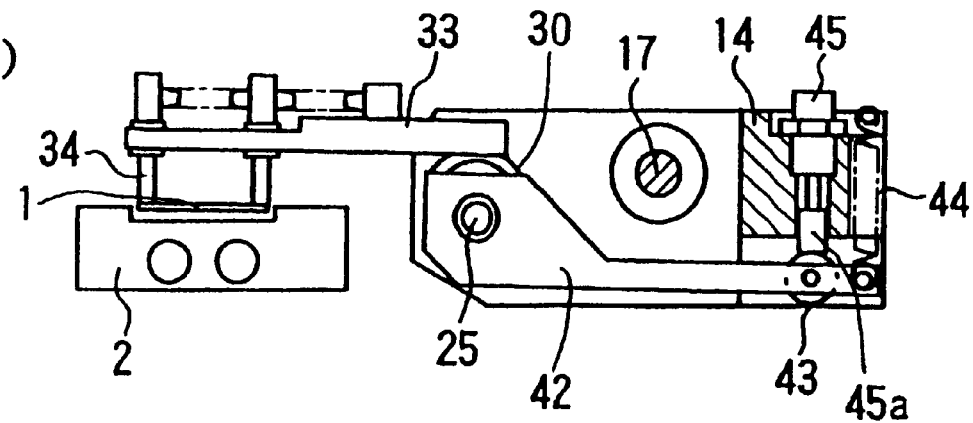
FIG. 5(b) is a partially sectional side view of the lead frame withdrawing section taken along the line b—b in FIG. 1.

Then, the vacuum suction operation of the vacuum suction nozzles 34 is initiated, and the lead frame 1 is vacuum chucked by vacuum suction. At the same time, the motor 21 (shown in FIGS. 1 and 2) is rotated so that the spring holder 11 and raising-and-lowering block 12 are raised by the rising profile of the eccentric cam 18. As a result, the frame retaining springs 10 are separated from the lead frame 1 as shown in FIG. 5(*a*).

Then, the operating rod 45a of the air cylinder 45 protrudes so as to push the roller 43 downward (overcoming the spring force of the spring 44), thus causing the swing arm 42, bearing holders 30 and 31 and frame withdrawing arm 33 to pivot in the clockwise direction about the feed pin drive shaft 25 as shown in FIGS. 4(*b*) and 5(*b*), so that the lead frame 1 is lifted approximately 1 to 2 mm from the heating block 2.

As seen from the above, since the lead frame 1 is thus vacuum-chucked by the vacuum suction nozzles 34 and lifted from the heating block 2, thermal damage to the lead frame 1 or semiconductor chips can be prevented. Furthermore, since the lead frame 1 is lifted approximately 1 to 2 mm from the heating block 2, a complete loss of the pre-heating heat applied prior to bonding does not occur. Moreover, since an extremely simple structure is employed in which lead frames are vacuum-chucked and then lifted by the vacuum suction nozzles 34, equipment costs can be low. In addition, since the structure is simple, maintenance can be accomplished in a short time when periodic maintenance is performed.

When the apparatus returns from a pause state, i.e., when the feeding operation of the lead frames 1 is resumed, the lead frame 1 which has been lifted as shown in FIG. (b) is placed back on the heating block 2 as shown in FIG. 3(b). Since this is performed by executing the above-described lift-up operation reversely, a detailed description is omitted.

Furthermore, the lead frames 1 used in the present invention may be lead frames cut into rectangular shapes, or continuous tape-form lead frames. Moreover, it would also be possible to use electromagnets instead of vacuum suction nozzles to lift up the lead frame from the heating block. In such a case, the lead frames 1 used are, of course, those made from magnetic materials. Furthermore, it is also possible to use claws to grasp the lead frames 1 in the direction of width thereof instead of vacuum suction nozzles 34.

As seen from the above, according to the present invention, a bonding apparatus includes a frame lifting means, which is installed above the heating block and lifts lead frames, and a driving means, which raises and lowers this frame lifting means; and lead frames on the heating block are lifted by the frame lifting means in cases where normal conveying of the lead frames is not performed. Accordingly, lead frames are hot damaged by heat by means of a simple structure.

What is claimed is:

1. A bonding apparatus which bonds semiconductor chips to lead frames positioned on a heating block or which bonds wires between semicondutor chips and leads of lead frames, said apparatus comprising a lead frame lifting means which is provided above said heating block so as to lift said lead frames 1 to 2 mm from said heater block, and a driving means which raises and lowers said lead frame lifting means, wherein lead frames on said heating block are lifted by said lead frame lifting means in cases where normal conveying of said lead frames is hindered to prevent thermal damage to said lead frames while a complete loss by the lead frames of preheating heat from the heating block is prevented.

2. A bonding apparatus according to claim 1, wherein said frame lifting means is a vacuum suction nozzle.

3. A bonding apparatus according to claim 1, wherein said frame lifting means is provided so as to be pivotable about a feed pin drive shaft, said feed pin drive shaft raising and lowering a feed pin that feeds said lead frames and further causing said feed pin to make a reciprocating motion in a direction in which said lead frame is conveyed.

* * * * *